US012754223B2

(12) United States Patent
Moon et al.

(10) Patent No.: US 12,754,223 B2
(45) Date of Patent: Oct. 6, 2026

(54) APPARATUS AND METHOD FOR CONTROLLING ELECTROMAGNETIC WAVES IN ELECTROMAGNETIC WAVES MEASUREMENT DEVICE

(71) Applicant: ELECTRONICS AND TELECOMMUNICATIONS RESEARCH INSTITUTE, Daejeon (KR)

(72) Inventors: Jung Ick Moon, Daejeon (KR); Jong Hwa Kwon, Daejeon (KR); Jung Nam Lee, Sejong-si (KR); Chang Hee Hyoung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 225 days.

(21) Appl. No.: 18/646,376

(22) Filed: Apr. 25, 2024

(65) Prior Publication Data

US 2025/0076359 A1 Mar. 6, 2025

(30) Foreign Application Priority Data

Sep. 5, 2023 (KR) ........................ 10-2023-0117435

(51) Int. Cl.
*G01R 29/10* (2006.01)
*G01R 29/08* (2006.01)

(52) U.S. Cl.
CPC ....... *G01R 29/105* (2013.01); *G01R 29/0878* (2013.01)

(58) Field of Classification Search
CPC .............. G01R 29/105; G01R 29/0878; G01R 29/0871; G01R 29/0814
See application file for complete search history.

(56) References Cited

U.S. PATENT DOCUMENTS

2010/0238086 A1 9/2010 Moon et al.
2018/0231593 A1 8/2018 Sim et al.
2019/0313266 A1* 10/2019 Rowell .............. G01R 29/0871
2021/0408656 A1* 12/2021 Correas-Serrano ..... H01P 5/022

FOREIGN PATENT DOCUMENTS

JP H8-160087 A 6/1996
KR 10-1874741 B1 7/2018
KR 10-2019-0058143 A 5/2019
KR 20190058143 A * 5/2019 ......... G01R 29/0878
KR 10-2023-0045821 A 4/2023

OTHER PUBLICATIONS

Translation of KR 20190058143 A (Year: 2019).*

* cited by examiner

*Primary Examiner* — Renan Luque

(57) ABSTRACT

According to an embodiment of the present disclosure, an apparatus for controlling electromagnetic waves in an electromagnetic wave measurement device, the apparatus comprising: a transmitting antenna configured to generate electromagnetic waves through an aperture that controls a radiation pattern; a mode stirrer configured to reflect electromagnetic waves generated by the transmitting antenna by a plurality of unit panels; and a radio wave measurement part configured to measure electromagnetic waves transmitted through the mode stirrer, wherein the transmitting antenna generates a beam by a high-order mode.

18 Claims, 7 Drawing Sheets

APPARATUS AND METHOD FOR CONTROLLING ELECTROMAGNETIC WAVES IN ELECTROMAGNETIC WAVES MEASUREMENT DEVICE

CROSS-REFERENCE TO RELATED APPLICATION

The present application claims priority to Patent Application No. 10-2023-0117435, filed on in Korea Intellectual Property Office on Sep. 5, 2023, the entire contents of which are incorporated herein by reference.

TECHNICAL FIELD

The present disclosure relates to an apparatus and method for controlling electromagnetic waves in an electromagnetic wave measurement device.

BACKGROUND

The content described below simply provides background information related to this embodiment and does not constitute related art.

There are various devices that measure the electromagnetic wave performance of antennas or devices generating electromagnetic waves, including outdoor test sites, radio anechoic chambers, and transverse electromagnetic (TEM) cells, etc. Among them, an electromagnetic wave reverberation room is a device in which, when a certain space is shielded with metal and a transmitting antenna in the electromagnetic wave reverberation room is fed, a multi-mode, multi-reflection and delay occur to create a radio wave environment similar to the outdoors within a preset region (e.g., a measurement space or working volume).

Therefore, various polarizations (X, Y, Z-polarization) exist in the measurement space within the electromagnetic wave reverberation room, and in general, the intensity of each polarization is made similar to each other to create a statistically uniform electric field. Also, the key to electromagnetic wave reverberation room design technology is how large the measurement space may be made compared to the total volume of the electromagnetic wave reverberation room.

The electromagnetic wave reverberation room uses a mode stirrer to increase the uniformity of the internal electric field, and a mechanical stirrer that rotates or moves a Z-shaped metal device linearly or an electric stirrer that controls the phase of an electric field using a meta surface is used. In cases in which the electric field uniformity does not meet a target performance, the performance is modified by adding a feed antenna or a stirrer, changing a location or a shape, or re-designing the meta surface in the case of the electric mode stirrer. Adding the feed antenna or a stirrer is disadvantageous in terms of installation space and manufacturing cost.

SUMMARY

In view of the above, the present disclosure provides an apparatus and method for generating a high-order mode in a transmitting antenna of an electromagnetic wave measurement device.

The present disclosure provides an apparatus and method for improving electric field uniformity without adjusting a direction of a transmitting antenna of an electromagnetic wave measurement device or modifying or replacing a mode stirrer.

The problems to be solved by the present disclosure are not limited to the problems mentioned above, and other problems not mentioned will be clearly understood by those skilled in the art from the description below.

According to some embodiments of the present disclosure, an apparatus for controlling electromagnetic waves in an electromagnetic wave measurement device, the apparatus comprising: a transmitting antenna configured to generate electromagnetic waves through an aperture that controls a radiation pattern; a mode stirrer configured to reflect electromagnetic waves generated by the transmitting antenna by a plurality of unit panels; and a radio wave measurement part configured to measure electromagnetic waves transmitted through the mode stirrer, wherein the transmitting antenna generates a beam by a high-order mode.

According to some embodiments of the present disclosure, a method for controlling electromagnetic waves in an electromagnetic wave measurement device, the method comprising: a process of generating, by a transmitting antenna, electromagnetic waves through an aperture that controls a radiation pattern; a process of reflecting, by a mode stirrer, the electromagnetic waves generated by the transmitting antenna by a plurality of unit panels; and a process of measuring, by a radio wave measurement part, electromagnetic waves transmitted through the mode stirrer, wherein the transmitting antenna generates a beam by a high-order mode.

The present disclosure may increase the performance of the electromagnetic wave measurement device by generating a high-order mode in the transmitting antenna of the electromagnetic wave measurement device.

The present disclosure may efficiently adjust polarization performance, while ensuring electric field uniformity, even without adjusting the direction of the transmitting antenna of the electromagnetic wave measurement device or modifying or replacing the mode stirrer.

The present disclosure may achieve the effect of arranging a plurality of antennas by generating a high-order mode in the transmitting antenna of the electromagnetic wave measurement device.

The present disclosure may reduce the cost of additionally installing the transmitting antenna and the mode stirrer of the electromagnetic wave measurement device.

The effects of the present disclosure are not limited to the effects mentioned above, and other effects not mentioned may be clearly understood by those skilled in the art from the description below.

DETAILED DESCRIPTION

Figure 1:
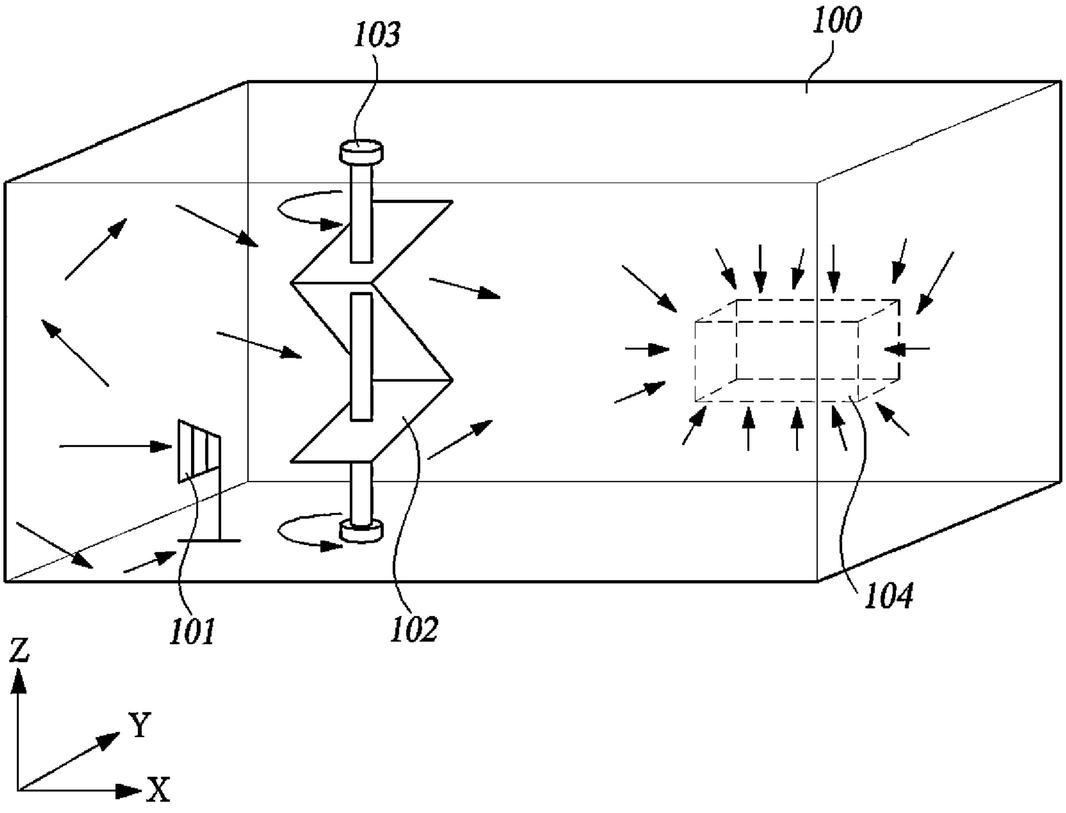
FIG. 1 is a block diagram of an apparatus for controlling electromagnetic waves in an electromagnetic wave measurement device.

Hereinafter, some embodiments of the present disclosure will be described in detail with reference to the accompanying drawings. In the following description, like reference numerals can designate like elements, even though the elements can be shown in different drawings. Further, the following description of some embodiments can omit, for the purpose of clarity and for brevity, a detailed description of related known components and functions when considered obscuring the subject of the present disclosure.

Various ordinal numbers or alpha codes such as "first", "second", "A", "B", "(a)", "(b)", etc., can be prefixed solely to differentiate one component from the other but not to necessarily imply or suggest the substances, order, or sequence of the components. Throughout this specification, when a part "includes" or "comprises" a component, the part is meant to allow for further including other components and to not exclude other components, unless specifically stated to the contrary. Terms such as "unit," "module," and the like can refer to units in which at least one function or operation is processed and they may be implemented by hardware, software, or a combination thereof.

The following detailed description is intended to describe exemplary embodiments of the present invention and is not intended to represent the only embodiments in which the present invention may be practiced.

In this specification, an electromagnetic wave measurement device may include, for example, an electromagnetic wave reverberation room.

In this specification, a transmitting antenna may include, for example, a feed antenna, a horn antenna, etc., but is not limited to a specific form.

Adding a feed antenna or stirrer is disadvantageous in terms of installation space and manufacturing cost. In order to solve this problem, in an embodiment of the present disclosure, a high-order mode is generated in the feed antenna to form a plurality of antenna beams, so that the effect of using multiple antennas may be obtained, which helps to increase the performance of the electromagnetic wave reverberation room. Accordingly, the embodiment of the present disclosure may increase the performance of the electromagnetic wave measurement device by generating a high-order mode in the feed antenna.

FIG. 1 is a block diagram of an apparatus for controlling electromagnetic waves in an electromagnetic wave measurement device.

Referring to FIG. 1, an electromagnetic wave measurement device 100 may include a transmitting antenna 101, a mode stirrer 102, a measurement space 104, etc. The measurement space 104 may be referred to as a "radio wave measurement part."

Inside the electromagnetic wave measurement device 100, a working volume of a rectangular parallelepiped, for example, in which a measurement object may be placed, is defined, and the standard deviation of an electromagnetic field measured at eight vertices of the working volume may be used as a measure indicating the performance of the electromagnetic wave reverberation room. The measurement space 104 may be referred to as a "working volume," and electromagnetic characteristics of various electronic devices may be measured in the measurement space 104.

The transmitting antenna 101 may generate electromagnetic waves, and the aperture of the transmitting antenna may be mounted toward a wall or an opposite direction of the measurement space 104 to prevent the electromagnetic waves from directly irradiating the measurement space 104.

The mode stirrer 102 includes a combination of a plurality of "Z" shaped unit panels, and the plurality of unit panels may rotate based on a pillar 103. The mode stirrer 102 may reflect electromagnetic waves generated by the transmitting antenna 101 by the plurality of unit panels. The mode stirrer 102 may reflect electromagnetic waves while the mode stirrer rotates, depending on the type of mode stirrer.

As shown in FIG. 1, electric fields are applied to the measurement space 104 in various directions at every moment, and while the mode stirrer 102 rotates one revolution, the strengthes of the electric field incident at every moment at the same point are added up and averaged. In other words, even at the same point, the strengthes of the electric field at each moment vary, but by taking the average value, statistically uniform electric field values in the X, Y, and Z directions may be obtained within a certain range. Here, a certain range refers to a target value for the standard deviation of the measured electric fields predetermined by a designer or user.

Therefore, a three-dimensional space within the electromagnetic wave reverberation room that satisfies the target uniformity of the electric field may be defined as a measurement space (or working volume).

However, the measurement space may be smaller than expected depending on design or manufacturing, and to expand or correct this, a method of adjusting the direction of the transmitting antenna 101 or modifying or replacing the mode stirrer 102 is used. Embodiments of the present disclosure may provide an apparatus and method for efficiently controlling polarization performance while ensuring electric field uniformity even without adjusting the direction of the transmitting antenna 101 or modifying or replacing the mode stirrer.

Figure 2:
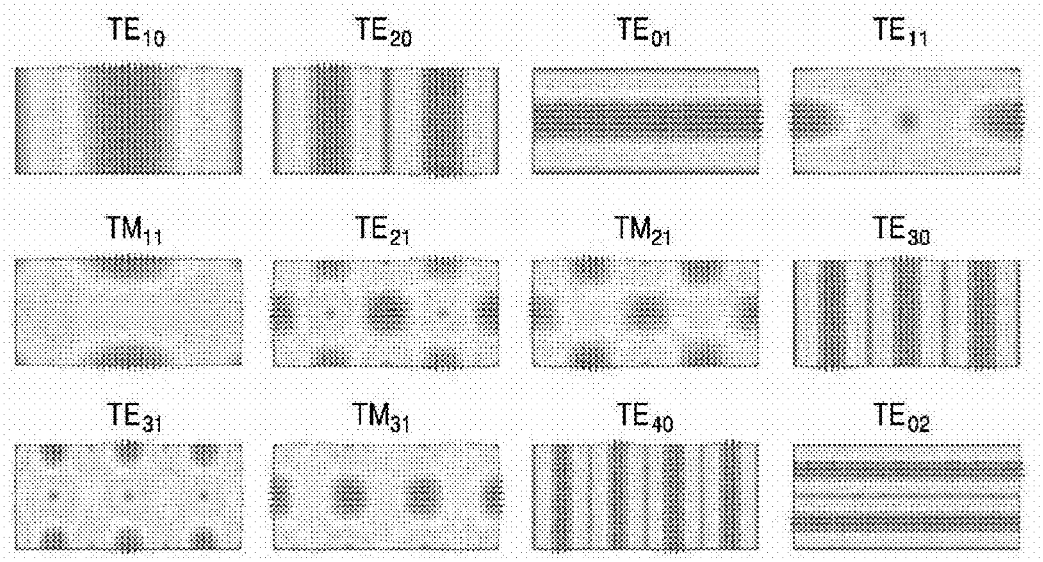
FIG. 2 is an exemplary diagram illustrating 12 modes generated in a rectangular waveguide applied to an embodiment of the present disclosure.

FIG. 2 is an exemplary diagram illustrating 12 modes generated according to an operating frequency in a rectangular waveguide applied to an embodiment of the present disclosure. Also, the number of these high-order modes increases as the operating frequency increases.

Transmitting antennas used for power feeding include, for example, horn antennas that use waveguides. In the transmitting antenna, fundamental modes and high-order modes of the rectangular waveguide are generated and radiated to an aperture, as shown in FIG. 2, depending on the operating frequency of the antenna.

The fundamental mode is, for example, TE10, and the high-order mode refers to high-order modes excluding the fundamental mode. In other words, high-order modes refer to all modes having a higher order than the fundamental mode. Hereinafter, the high-order mode is referred to as, for example, TE30, but is not limited to a specific form.

In TE10, TE is an abbreviation for "transverse electric mode". The TE mode is a form in which an electric field component is perpendicular to a direction of electromagnetic waves. A cross-sectional electric field distributions of 12 modes in a rectangular waveguide (alignment criteria are cutoff frequencies for aspect ratio a/b=2) are shown in FIG. 2. For example, in the case of transverse magnetic (TM) mode, the smallest possible index is 1. The TM mode is a type in which the magnetic field component is perpendicular to the direction of electromagnetic waves.

Figure 3A:
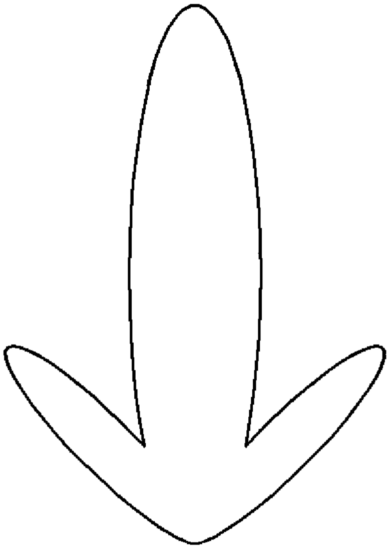
FIG. 3A and FIG. 3B are an example of a radiation pattern of a horn antenna generated according to a fundamental mode and a high-order mode applied to an embodiment of the present disclosure.
Figure 3B:
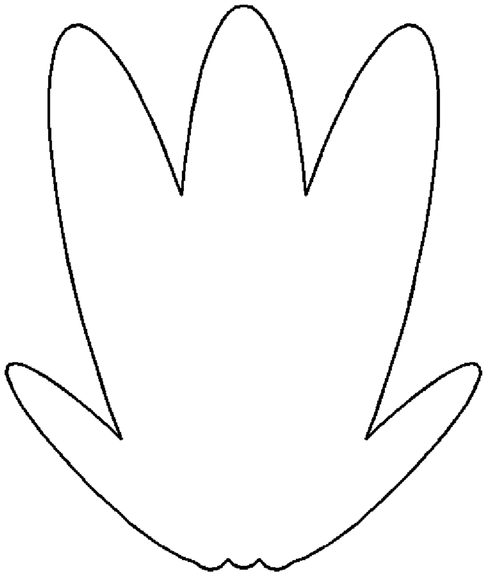

FIG. 3A and FIG. 3B are an example of radiation patterns of a horn antenna generated according to the fundamental mode and the high-order mode applied to an embodiment of the present disclosure.

FIG. 3A is a view of a radiation pattern of the fundamental mode, illustrating a radiation pattern in which a mountain-shaped main beam having the highest electric field value at the center is radiated.

FIG. 3B is a view of a radiation pattern of the TE10 mode among the high-order modes, illustrating a radiation pattern in which a mountain-shaped beam with three peaks radiates in different directions.

Figure 4:
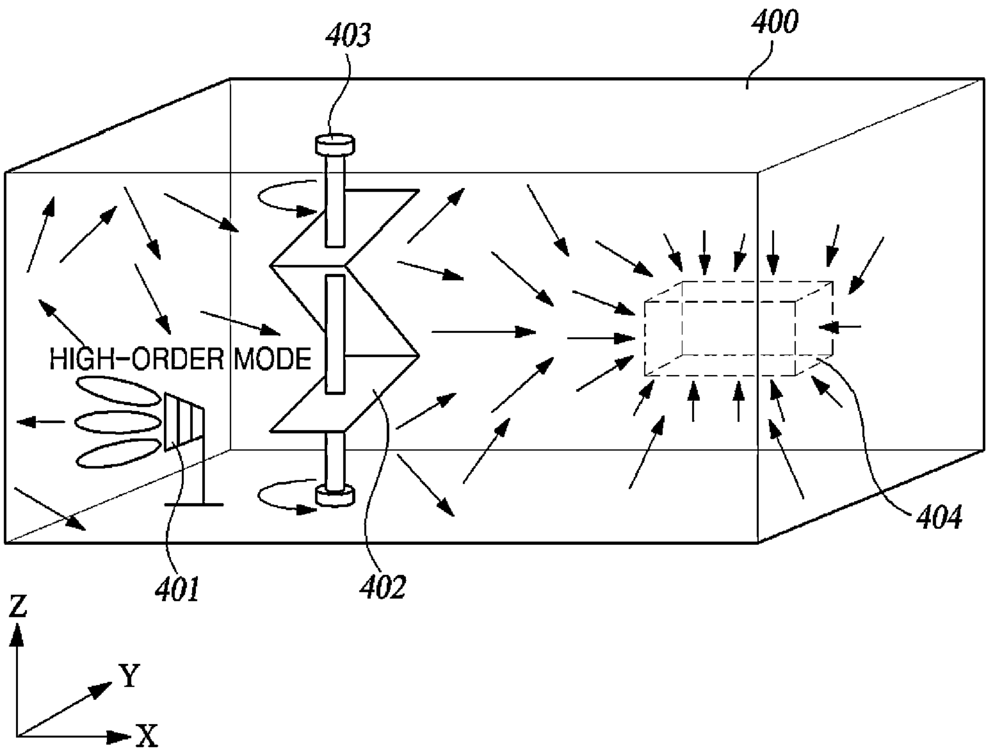
FIG. 4 is a block diagram of an apparatus for controlling electromagnetic waves in an electromagnetic wave measurement device according to an embodiment of the present disclosure.

FIG. 4 is a block diagram of an apparatus for controlling electromagnetic waves in an electromagnetic wave measurement device according to an embodiment of the present disclosure.

The electromagnetic wave measurement device 400 may include an apparatus for measuring electromagnetic wave performance (eg, radiation performance of electronic devices, electromagnetic compatibility (EMC), etc.).

Referring to FIG. 4, the electromagnetic wave measurement device 400 may include a transmitting antenna 401, a mode stirrer 402, a pillar 403, and a measurement space 404, etc. The electromagnetic wave measurement device 400 may further include a metallic reflective wall surface. The metallic reflective wall surface may reflect electromagnetic waves radiated from the transmitting antenna 401 toward the measurement space 404.

The electromagnetic wave measurement device 400 may have a shape of a polyhedron and may be a shielded space that adjusts the characteristics of electromagnetic waves.

The transmitting antenna 401 may generate high-order mode electromagnetic waves and may be installed with an aperture facing a metallic reflective wall surface so as not to irradiate directly to the measurement space 404. The transmitting antenna 401 may include a mode generator not shown in the drawing. The mode generator generates a high-order mode according to an embodiment of the present disclosure.

The mode stirrer 402 includes a plurality of 'Z'-shaped unit panels periodically combined to form one complete form, and the plurality of unit panels may rotate based on the pillar 403. The mode stirrer 402 may reflect electromagnetic waves generated from the transmitting antenna 401 into the measurement space 404 by using the plurality of unit panels. The unit panel may include at least one of polygonal, circular, and loop shapes. The sizes of the panels may all be the same or different. The mode stirrer 202 may have various structures depending on the panel's bending information, bending direction, bending inclination, and bending angle.

Electric fields may be incident on the measurement space 404 in various directions at every moment, and signals of various polarization waves may be incident with uniform polarization due to beam generation by the high-order mode of the transmitting antenna 401 according to an embodiment of the present disclosure.

In an embodiment of the present disclosure, an electric field with a specific polarization in a specific space may be formed in the electromagnetic wave reverberation room and the polarization characteristics of the measurement device may be adjusted depending on the frequency.

Figure 5:
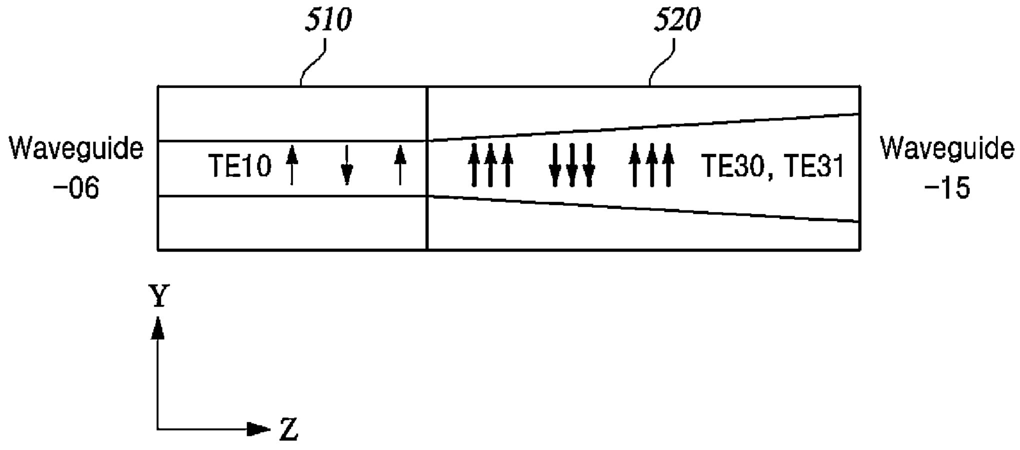
FIG. 5 is an example of generating a high-order mode using a transition type waveguide according to an embodiment of the present disclosure.

FIG. 5 is an example of generating a high-order mode using a transition type waveguide according to an embodiment of the present disclosure.

The transmitting antenna according to an embodiment of the present disclosure may use a transition type waveguide 520, as shown in FIG. 5, to generate a high-order mode.

A first waveguide 510 is a WR-06 waveguide in which only the fundamental mode exists in the frequency range of 110 to 170 GHz.

The second waveguide 520 is a mode transition device and includes, for example, a transition type waveguide that changes WR-06 to WR-15, and is not limited to a specific form.

Therefore, as the frequency incident from WR-06 changes to WR-15, not only the fundamental mode but also the high-order mode occurs. For example, when 145 GHz is incident from the left side of FIG. 5 and proceeds in the Z direction, it proceeds in the fundamental mode in the first waveguide 510, but TE30 and TE31 may naturally be generated while passing through the second waveguide 520. In an embodiment of the present disclosure, the uniformity of the electric field incident on the measurement space may be improved by obtaining the effect of installing a plurality of antennas in the electromagnetic wave reverberation room by using the high-order mode of the antenna.

As an additional possible embodiment, the second waveguide 520 converts a first mode to a second mode. At this time, the first mode refers to a fundamental mode, and the second mode refers to a high-order mode. The second waveguide 520 may have a predetermined angle as changed in a shape in which the aperture is wider than the first waveguide 510 for mode switching. The predetermined angle may be formed to be different depending on the mode to be switched.

Figure 6:
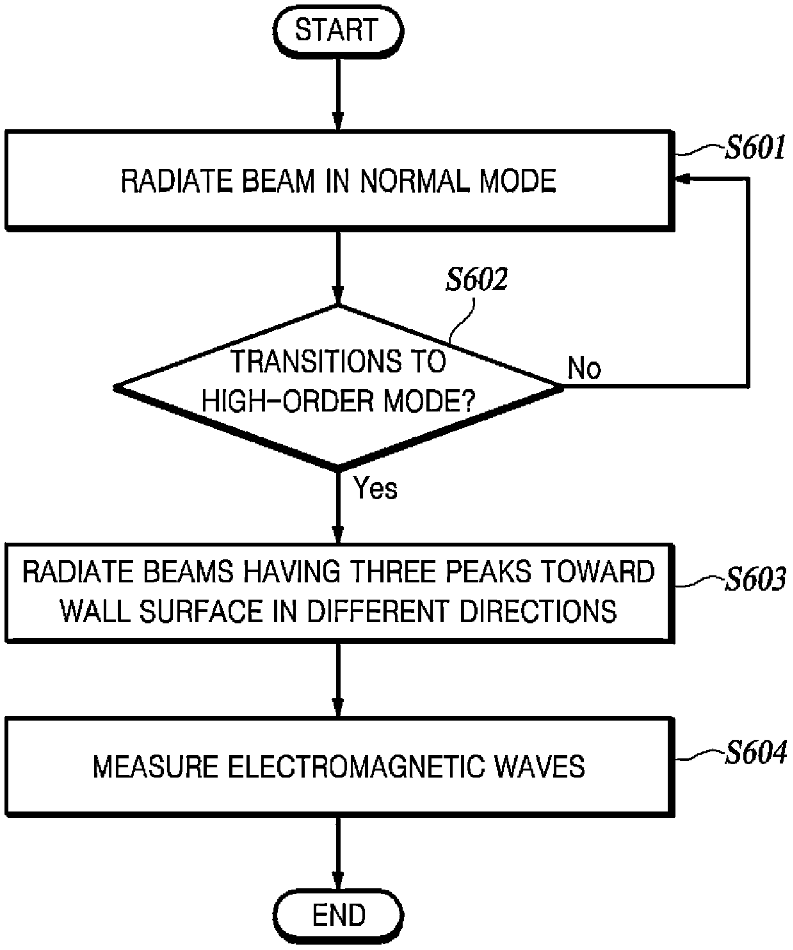
FIG. 6 is a flowchart illustrating a method of controlling electromagnetic waves in an electromagnetic wave measurement device according to an embodiment of the present disclosure.

FIG. 6 is a flowchart of an operation in an apparatus for controlling electromagnetic waves in an electromagnetic wave measurement device according to an embodiment of the present disclosure.

The apparatus for controlling electromagnetic waves in the electromagnetic wave measurement device radiates a beam in a normal mode in operation S601.

In operation S602, the apparatus for controlling electromagnetic waves in the electromagnetic wave measurement device may determine whether a transition from the normal mode to a high-order mode has occurred in the transmitting antenna according to an input frequency of the transmitting antenna.

If a transition from the normal mode to a high-order mode occurs in operation S601, the apparatus for controlling electromagnetic waves in the electromagnetic wave measurement device may control a plurality of beams generated by the high-order mode to be radiated in different directions toward the metallic reflective wall surface in operation S603. Thereafter, the electromagnetic waves reflected by the metallic reflective wall surface and the mode stirrer 402 may be transmitted to the measurement space 404.

Meanwhile, if the transition from the normal mode to the high-order mode does not occur in operation S601, the apparatus for controlling electromagnetic waves in the electromagnetic wave measurement device controls the beam to be radiated in the normal mode toward the metallic reflective wall surface in operation S601.

Meanwhile, after operation S603, the apparatus for controlling electromagnetic waves in the electromagnetic wave measurement device is controlled to measure the electromagnetic waves reflected from the mode stirrer in operation S604.

Radio waves incident on the measurement space 404 are incident as uniformly polarized waves, thereby improving electromagnetic wave polarization performance.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM) and any other known computer readable medium. A processor and a memory may be supplemented by, or integrated into, a special purpose logic circuit.

The processor may run an operating system (OS) and one or more software applications that run on the OS. The processor device also may access, store, manipulate, process, and create data in response to execution of the software. For purpose of simplicity, the description of a processor device is used as singular; however, one skilled in the art will be appreciated that a processor device may include multiple processing elements and/or multiple types of processing elements. For example, a processor device may include multiple processors or a processor and a controller. In addition, different processing configurations are possible, such as parallel processors.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

What is claimed is:

1. An apparatus for controlling electromagnetic waves in an electromagnetic wave measurement device, the apparatus comprising:

a transmitting antenna configured to generate electromagnetic waves through an aperture that controls a radiation pattern;

a mode stirrer configured to reflect electromagnetic waves generated by the transmitting antenna by a plurality of unit panels; and a radio wave measurement part configured to measure electromagnetic waves transmitted through the mode stirrer, wherein the transmitting antenna generates a beam by a high-order mode, wherein a normal mode represents that one beam having the highest field value in a center radiates, wherein the high-order mode represents that three or more beams radiate in different directions, and wherein the three or more beams have uniform field characteristics.

2. The apparatus of claim 1, wherein the transmitting antenna radiates a beam transitioned from the normal mode to the high-order mode.

3. The apparatus of claim 1, wherein, when the transmitting antenna transitions from the normal mode to the high-order mode according to an input frequency, the transmitting antenna radiates a plurality of beams having different directions.

4. The apparatus of claim 1, wherein, when generating a beam by the high-order mode, the transmitting antenna radiates a plurality of beams in different directions toward a wall surface of the radio wave measurement part.

5. The apparatus of claim 1, wherein, when transitioning from the normal mode to the high-order mode, an aperture size of the transmitting antenna is increased and the transmitting antenna has a predetermined angle.

6. The apparatus of claim 5, wherein the predetermined angle is formed to be different depending on the high-order mode to be converted.

7. The apparatus of claim 6, wherein the high-order mode represents a mode that occurs according to an operating frequency.

8. The apparatus of claim 1, wherein the three or more beams of the high-order mode operate as a horn antenna.

9. The apparatus of claim 1, wherein the normal mode comprises a transverse electric (TE) 10 mode, wherein the high-order mode comprises one of a TE30 mode and a TE31 mode.

10. A method for controlling electromagnetic waves in an electromagnetic wave measurement device, the method comprising:

a process of generating, by a transmitting antenna, electromagnetic waves through an aperture that controls a radiation pattern;

a process of reflecting, by a mode stirrer, the electromagnetic waves generated by the transmitting antenna by a plurality of unit panels; and a process of measuring, by a radio wave measurement part, electromagnetic waves transmitted through the mode stirrer, wherein the transmitting antenna generates a beam by a high-order mode, wherein a normal mode represents that one beam having the highest field value in a center radiates, wherein the high-order mode represents that three or more beams radiate in different directions, and wherein the three or more beams have uniform field characteristics.

11. The method of claim 10, wherein the transmitting antenna radiates a beam transitioned from the normal mode to the high-order mode.

12. The method of claim 10, wherein, when the transmitting antenna transitions from the normal mode to the high-order mode according to an input frequency, the transmitting antenna radiates a plurality of beams having different directions.

13. The method of claim 10, wherein, when generating a beam by the high-order mode, the transmitting antenna radiates a plurality of beams in different directions toward a wall surface of the radio wave measurement part.

14. The method of claim 10, wherein, when transitioning from the normal mode to the high-order mode, an aperture size of the transmitting antenna is increased and the transmitting antenna has a predetermined angle.

15. The method of claim 14, wherein the predetermined angle is formed to be different depending on the high-order mode to be converted.

16. The method of claim 15, wherein the high-order mode represents a mode that occurs according to an operating frequency.

17. The method of claim 10, wherein the three or more beams of the high-order mode operate as a horn antenna.

18. The method of claim 10, wherein the normal mode comprises a transverse electric (TE) 10 mode, wherein the high-order mode comprises one of a TE30 mode and a TE31 mode.

* * * * *